(12) United States Patent
Gardner et al.

(10) Patent No.: US 6,420,220 B1
(45) Date of Patent: Jul. 16, 2002

(54) METHOD OF FORMING ELECTRODE FOR HIGH PERFORMANCE SEMICONDUCTOR DEVICES

(75) Inventors: Mark I. Gardner, Cedar Creek; H. Jim Fulford, Austin, both of TX (US); Charles E. May, Gresham, OR (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/292,913

(22) Filed: Apr. 16, 1999

(51) Int. Cl.[7] ............................................. H01L 21/00
(52) U.S. Cl. ...................................................... 438/151
(58) Field of Search .................................. 438/151, 164, 438/303, 655, 682, 657, 586

(56) References Cited

U.S. PATENT DOCUMENTS 5,424,572 A * 6/1995 Solheim ...................... 257/370
5,814,537 A * 9/1998 Maa et al. ................... 438/151
6,140,218 A * 10/2000 Liu et al. ..................... 438/597

* cited by examiner

Primary Examiner—Richard Elms
Assistant Examiner—Pho Luu
(74) Attorney, Agent, or Firm—Williams, Morgan & Amerson

(57) ABSTRACT

A method is provided for fabricating a semiconductor device, the method including forming a dielectric layer above a structure, forming a silicidable layer above the dielectric layer and forming a conductive layer above the silicidable layer. The method also includes forming a silicided layer by siliciding a portion of the conductive layer using at least a portion of the silicidable layer and forming a gate conductor having sides by patterning the silicided layer and the conductive layer.

20 Claims, 13 Drawing Sheets

METHOD OF FORMING ELECTRODE FOR HIGH PERFORMANCE SEMICONDUCTOR DEVICES

BACKGROUND OF THE INVENTION

1. Field of the Invention

This invention relates generally to semiconductor fabrication technology, and, more particularly, to a method of fabricating a transistor.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g, transistors. That is, many components of a typical field effect transistor (FET), e.g., channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, the drive to increase the operating speed of the transistors is often hampered by the choice of materials that are typically used for the gate conductor, for example. One convenient and relatively inexpensive material for the gate conductor is polycrystalline silicon (polysilicon or poly). The polysilicon is typically doped, for example, with arsenic (As) for an N-channel metal oxide semiconductor FET (NMOSFET or NMOS transistor), or boron (B) for a P-channel MOSFET (PMOSFET or PMOS transistor), to render the polysilicon more conductive. The doping of the polysilicon may conveniently be accomplished by diffusing or implanting the dopant atoms or molecules through the upper surface of a polysilicon gate conductor. However, the dopant atoms or molecules may not penetrate all the way through the polysilicon gate conductor down to the gate dielectric, even when driven by a heat-treating process such as a rapid thermal anneal (RTA). This is often referred to as a "poly depletion effect," and increases the resistivity and decreases the conductivity of the "poly depleted" polysilicon gate conductor, decreasing the operating speed of the transistor.

The present invention is directed to overcoming, or at least reducing the effects of, one or more of the problems set forth above.

SUMMARY OF THE INVENTION

In one aspect of the present invention, a method is provided for fabricating a semiconductor device, the method including forming a dielectric layer above a structure, forming a silicidable layer above the dielectric layer and forming a conductive layer above the silicidable layer. The method also includes forming a silicided layer by siliciding a portion of the conductive layer using at least a portion of the silicidable layer and forming a gate conductor having sides by patterning the silicided layer and the conductive layer.

In another aspect of the present invention, a semiconductor device is provided including a gate dielectric above a structure and a gate conductor above the gate dielectric. The gate conductor of the semiconductor device has sides and includes a silicided layer above the gate dielectric and a conductive layer above the silicided layer.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
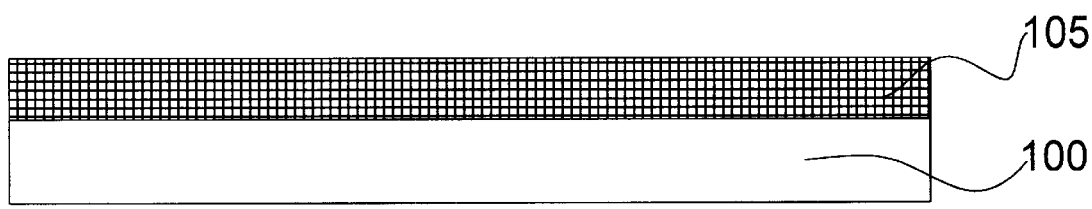
FIGS. 1–7 illustrate schematically in cross-section various embodiments of a method for transistor fabrication according to the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for transistor fabrication according to the present invention are shown in FIGS. 1–23. Although the various regions and structures of a, semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed towards the manufacture of a semiconductor device. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like.

As shown in FIG. 1 (FIG. 8), a dielectric layer 105 (805 in FIG. 8) may be formed above a structure 100 (800 in FIG. 8) such as a semiconducting substrate. However, the present invention is not limited to the formation of a transistor above the surface of a semiconducting substrate such as a silicon wafer, for example. Rather, as will be apparent to one skilled in the art upon a complete reading of the present disclosure, a transistor formed in accordance with the present invention may be formed above previously formed semiconductor devices, e.g., transistors, or other similar structure. In effect, the present invention may be used to form transistors on top of previously formed transistors, as shown in FIGS. 19–23, for example.

The dielectric layer 105 (805 in FIG. 8) may be formed by a variety of known techniques for forming such layers, e.g., chemical vapor deposition (CVD), low-pressure CVD (LPCVD), plasma-enhanced CVD (PECVD), sputtering and physical vapor deposition (PVD), and the like, and may have an equivalent oxide thickness $t_{ox-eq}$ ranging from approximately 10–20 Å, for example. An equivalent oxide thickness $t_{ox-eq}$ may be defined to be the thickness t of a dielectric material (with a dielectric constant K) that would have a capacitance C that is approximately the same as the capacitance $C_{ox}$ that a thickness $t_{ox-eq}$ of silicon dioxide ($SiO_2$) would have. Since $SiO_2$ has a dielectric constant $K_{ox}$ of approximately 4, and since C=K/t and $C_{ox}=K_{ox}/t_{ox-eq}$, then $t=K/C=K/C_{ox}=Kt_{ox-eq}/K_{ox}=Kt_{ox-eq}/4$, approximately. For example, if the dielectric layer 105 (805 in FIG. 8) were formed of silicon nitride ($Si_3N_4$) with a dielectric constant $K_{nitride}$ of approximately 8, then an equivalent oxide thickness $t_{ox-eq}$ ranging from approximately 10–20 Å would correspond to a nitride thickness $t_{nitride}$ ranging from approximately 20–40 Å.

Eventually, as described more fully below, portions of the dielectric layer 105 (805 in FIG. 8) will become the gate dielectric for a transistor. The dielectric layer 105 (805 in FIG. 8) may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon nitride ($Si_3N_4$), silicon oxynitride ($Si_xO_yN_z$), and the like. The dielectric layer 105 (805 in FIG. 8) may be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. In one illustrative embodiment, the dielectric layer 105 (805 in FIG. 8) is comprised of silicon nitride ($Si_3N_4$) having a thickness of approximately 20 Å, which is formed by an LPCVD process for higher throughput.

In another illustrative embodimnet, the dielectric layer 105 (805 in FIG. 8) may be formed of tantalum oxide ($Ta_xO_y$, e.g., $Ta_2O_5$) with a dielectric constant $K_{TaO}$ of approximately 24. Then, using $t=K_{TaO}/C=K_{TaO}/C_{ox}=K_{TaO}t_{ox-eq}/K_{ox}=24t_{ox-eq}/4$, approximately, an equivalent oxide thickness $t_{ox-eq}$ ranging from approximately 10–20 Å would correspond to a $Ta_xO_y$ thickness $t_{TaO}$ ranging from approximately 60–120 Å. Alternatively, in yet another illustrative embodiment, the dielectric layer 105 (805 in FIG. 8) may be formed of barium strontium titanate (BST, $BaTiO_3/SrTiO_3$) with a dielectric constant $K_{BST}$ of approximately 250. Then, using $t=K_{BST}/C=K_{BST}/C_{ox}=K_{BST}t_{ox-eq}/K_{ox}=250t_{ox-eq}/4$, approximately, an equivalent oxide thickness $t_{ox-eq}$ ranging from approximately 10–20 Å would correspond to a BST thickness $t_{BST}$ ranging from approximately 625–1250 Å.

The use of high K materials for the dielectric layer 105 (805 in FIG. 8) increases the total physical thickness of the dielectric layer 105 (805 in FIG. 8) as compared with the use of $SiO_2$, for example. Generally, the thicker the gate dielectric, the harder it is for charge carriers such as electrons to tunnel quantum mechanically through the gate dielectric layer, for example. Since the high K materials have a higher dielectric constant $K_{high}$ than the $K_{ox}$ of approximately 4 for $SiO_2$, a thicker layer of high K material, having a thickness of $t_{highK}$, may have substantially the same capacitance $C_{ox}$ that an "ultrathin" layer of $SiO_2$, having a thickness $t_{ox}$, would have. Indeed, since $C_{ox}=K_{ox}/t_{ox}=C_{highK}=K_{high}/t_{highK}$, then $t_{highK}/t_{ox}=K_{high}/K_{ox}=K_{high}/4$, approximately. Therefore, having $K_{high}$ greater than about 4, leads to $t_{highK}$ being greater than $t_{ox}$, leading to much less quantum mechanical tunneling through a high K material that has an equivalent oxide thickness $t_{ox-eq}$ than through $SiO_2$ that has a thickness $t_{ox}=t_{ox-eq}$.

Figure 2:
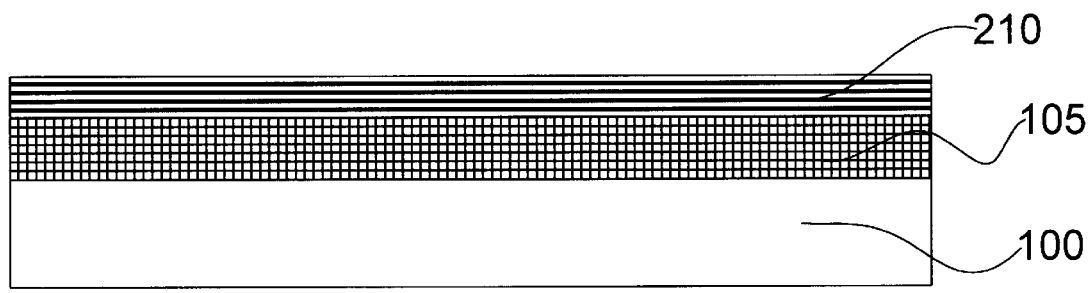
Figure 8:
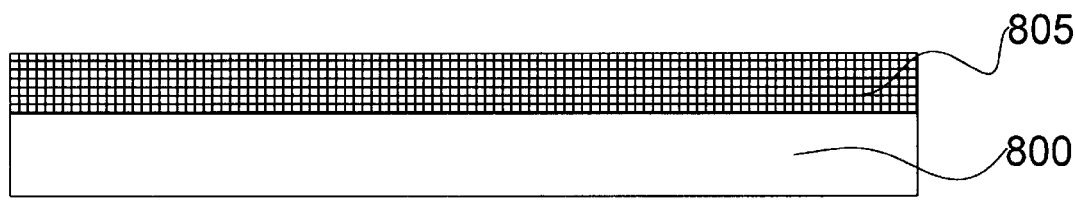
FIGS. 8–18 illustrate schematically in cross-section various additional embodiments of a method for transistor fabrication according to the present invention.

As shown in FIG. 2 (FIG. 9), a silicidable layer 210 (910 in FIG. 9) may be formed above the dielectric layer 105 (805 in FIG. 8). Eventually, as described more fully below, at least portions of the silicidable layer 210 may be used to form a silicided layer 410 (see FIG. 4). Similarly, as described more fully below, at least portions of the silicidable layer 910 (see FIG. 9) may be used to form a silicided layer 1210 (see FIG. 12). The silicidable layers 210 and 910 may be undoped silicon (Si), polysilicon, amorphous silicon (α-Si), and the like. Alternatively, as described more fully below, at least portions of the silicidable layer 2210 may be used to form a silicided layer 2215 (see FIG. 22). In this case, the silicidable layer 2210 may be titanium (Ti), cobalt (Co), tantalum (Ta), tungsten (W), and the like.

The silicidable layer 210 (910 in FIG. 9) may be formed by a variety of known techniques for forming such layers, e.g., CVD, LPCVD, PECVD, PVD, and the like, and may have a thickness ranging from approximately 50–200 Å. In one illustrative embodiment, the silicidable layer 210 (910 in FIG. 9) is comprised of undoped polysilicon, having a thickness of approximately 50 Å, which is formed by an LPCVD process for higher throughput.

Figure 3:
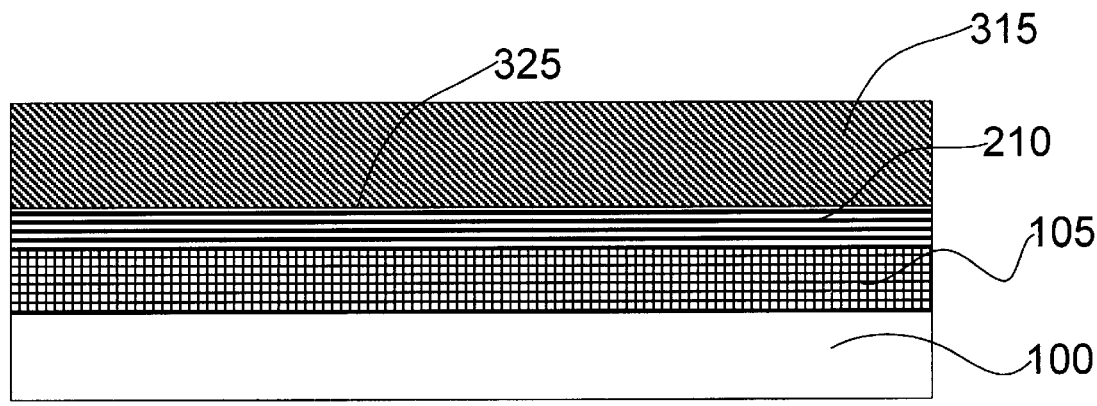
Figure 9:
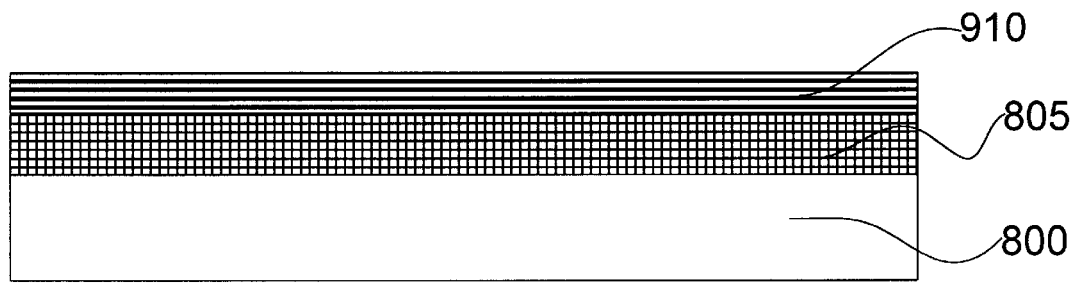

As shown in FIG. 3 (FIG. 10), a first conductive layer 315 (1015 in FIG. 10) may be formed above the silicidable layer 210 (910 in FIG. 9). Eventually, as described more fully below, portions of the first conductive layer 315, along with at least portions of the silicidable layer 210, may be used to form the silicided layer 410 (see FIG. 4). Similarly, as described more fully below, portions of the first conductive layer 1015 (see FIG. 10), along with at least portions of the silicidable layer 910 (see FIG. 9), may be used to form a silicided layer 1210 (see FIG. 12). The first conductive layers 315 and 1015 may be titanium (Ti), cobalt (Co), tantalum (Ta), tungsten (W), and the like. Alternatively, as described more fully below, portions of the first conductive layer 2230 (see FIG. 22), along with at least portions of the silicidable layer 2210, may be used to form a silicided layer 2215 (see FIG. 22). In this case, the first conductive layer 2230 may be undoped silicon (Si), polysilicon, amorphous silicon (α-Si), and the like.

The first conductive layer 315 (1015 in FIG. 10) may be formed by a variety of known techniques for forming such layers, e.g., CVD, PVD, LPCVD, PECVD, and the like, and may have a thickness ranging from approximately 25–400 Å, as measured from the top surface 325 (1025 in FIG. 10) of the silicidable layer 210 (910 in FIG. 9). In one illustrative embodiment, the first conductive layer 315 (1015 in FIG. 10) is comprised of cobalt (Co), having a thickness of approximately 100 Å, which is blanket-deposited, for example, in a nitrogen ($N_2$) ambient.

Figure 4:
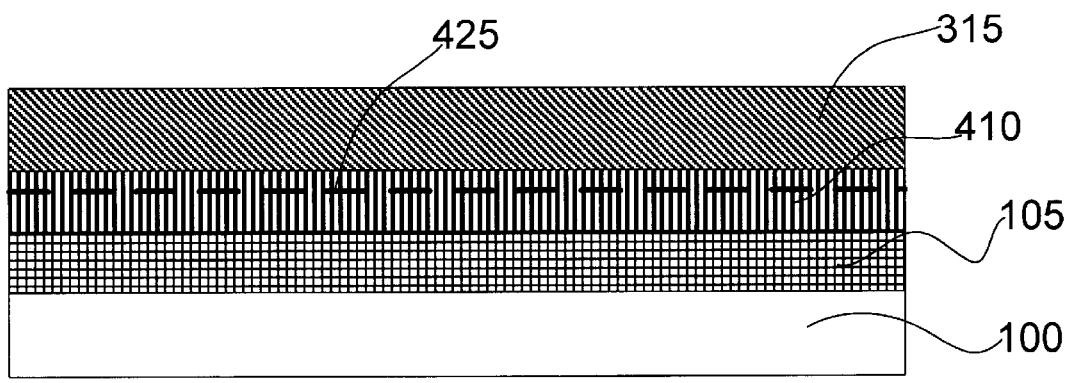

As shown in FIG. 4 (FIG. 12), a silicided layer 410 (1210 in FIG. 12) is formed by siliciding a portion the first conductive layer 315 (1015 in FIG. 10) using at least a portion, and in certain cases all, of the silicidable layer 210 (910 in FIG. 9). The dashed line 425 (1225 in FIG. 12) illustrates where the top surface 325 (1025 in FIG. 10) of the silicidable layer 210 (910 in FIG. 9) was before the silicidation. This silicidization of the bottom of a gate conductor 1550 (see FIG. 15, the gate conductor 1550 including layers 1210, 1015 and 1130) of a transistor 1985A (see FIG. 19), for example, renders the gate conductor 1550 more conductive, decreasing the resistivity of the gate conductor 1550 and increasing the operating speed of the transistor 1985A (see FIG. 19). A portion of the first conductive layer 315 (1015 in FIG. 10) and at least a portion, and in certain cases all, of the silicidable layer 210 (910 in FIG. 9) are subjected to a heat-treating process. This heat-treating process converts the portion of the first conductive layer 315 (1015 in FIG. 10) and at least a portion, and in certain cases all, of the silicidable layer 210 (910 in FIG. 9) into a metal silicide.

In one illustrative embodiment, the silicidable layer 210 (910 in FIG. 9) is comprised of undoped polysilicon, having a thickness of approximately 50 Å, and the first conductive layer 315 (1015 in FIG. 10) is comprised of cobalt (Co), having a thickness of approximately 100 Å. In this case, the metal silicide formed by the silicidation may be cobalt silicide (CoSi), cobalt disilicide ($CoSi_2$) or dicobalt silicide ($Co_2Si$), for example. It is believed that the formation of CoSi would consume approximately equal amounts of Co and Si. Therefore, substantially all of the approximately 50 Å of the undoped polysilicon silicidable layer 210 (910 in FIG. 9) and substantially half of the approximately 100 Å of the Co first conductive layer 315 (1015 in FIG. 10) would be converted to an approximately 100 Å CoSi silicided layer 410 (1210 in FIG. 12).

Similarly, it is believed that the formation of $CoSi_2$ would consume approximately twice as much Si as Co. Therefore, substantially all of the approximately 50 Å of the undoped polysilicon silicidable layer 210 (910 in FIG. 9) and substantially a quarter of the approximately 100 Å of the Co first conductive layer 315 (1015 in FIG. 10) would be converted to an approximately 75 Å $CoSi_2$ silicided layer 410 (1210 in FIG. 12).

Likewise, it is believed that the formation of $Co_2Si$ would consume approximately twice as much Co as Si. Therefore, substantially all of the approximately 50 Å of the undoped polysilicon silicidable layer 210 (910 in FIG. 9) and substantially all of the approximately 100 Å of the Co first conductive layer 315 (1015 in FIG. 10) would be converted to an approximately 150 Å $Co_2Si$ silicided layer 410 (1210 in FIG. 12).

Figure 5:
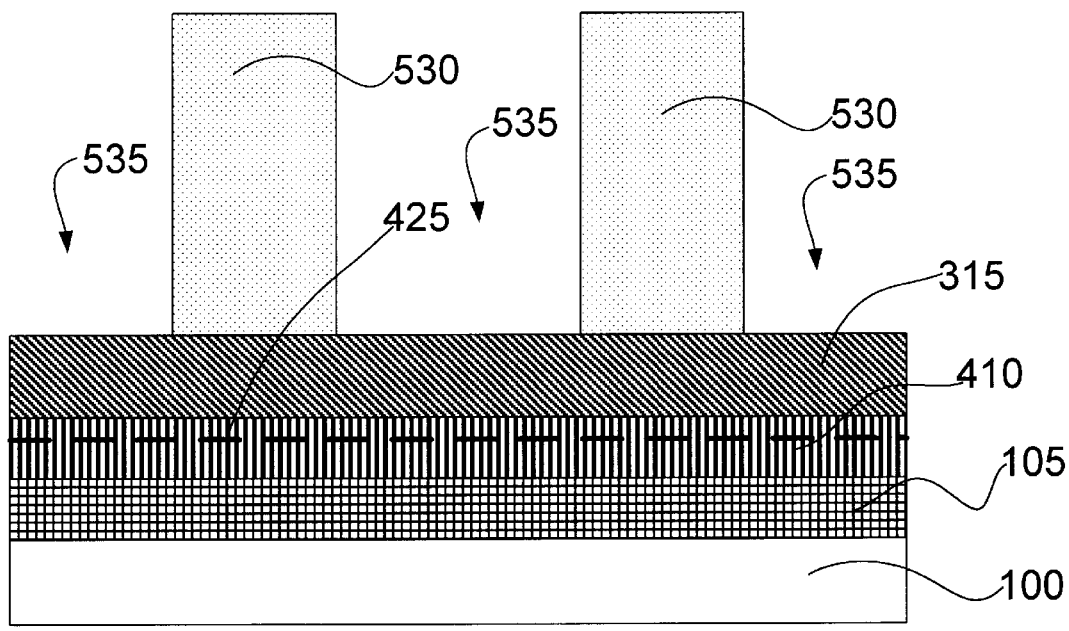
Figure 6:
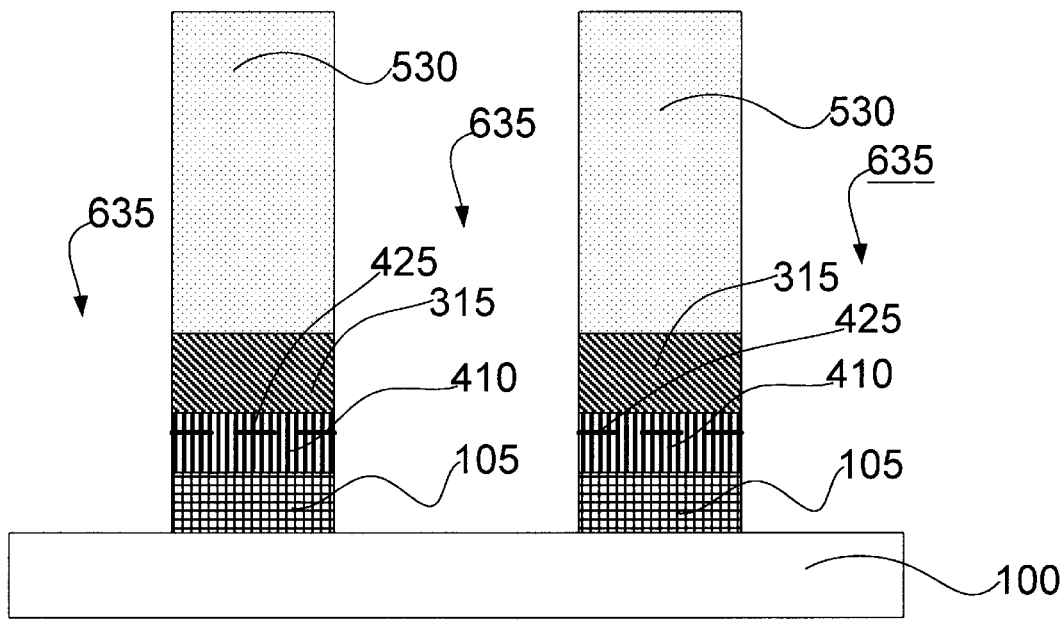

As shown in FIG. 5, a mask 530 of photoresist, for example, may be formed above the first conductive layer 315 and may be patterned to define openings 535 in the photoresist mask 530. The photoresist mask 530 may have a thickness ranging from approximately 10000–15000 Å (10 kÅ–15 kÅ), for example. As shown in FIGS. 5–6, the first conductive layer 315, the silicided layer 410 and the dielectric layer 105 may then be etched, using the photoresist mask 530, for example, forming the openings 635 that correspond to the openings 535 in the photoresist mask 530.

Figure 7:
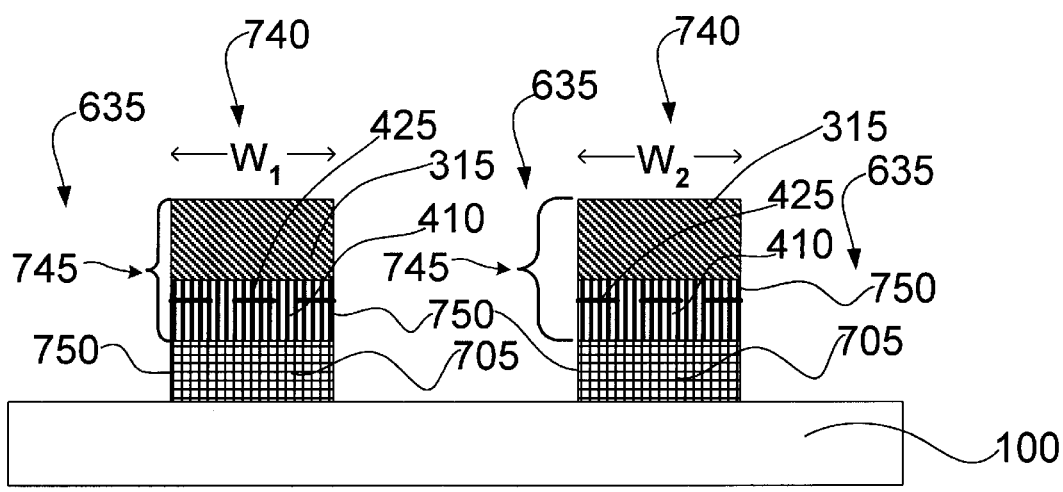

As shown in FIG. 7, the openings 635 define gate structures 740 including gate conductors 745 and gate dielectrics 705 having sides 750. The gate conductors 745 include portions of the first conductive layer 315 and the silicided layer 410. The gate dielectrics 705 include portions of the dielectric layer 105 (see FIGS. 1–6). As shown in FIG. 7, the photoresist mask 530, for example, may then be removed by being stripped off.

As shown in FIGS. 5–7, the openings 635 and gate structures 740 may be formed using a variety of known photolithography and etching techniques, such as an anisotropic etching process using hydrogen bromide (HBr) and argon (Ar) as the etchant gases, for example. The gate structures 740 may have widths $W_1$ and $W_2$ that may be varied as a matter of design choice. For example, the widths $W_1$ and $W_2$ of the gate structures 740 may range from approximately 1000–2000 Å. The neighboring gate structures 740 may have substantially the same widths $W_1$ and $W_2$. Alternatively, the neighboring gate structures 740 may have substantially different widths $W_1$ and $W_2$, such as in a CMOS structure, for example, where the NMOS transistor and the PMOS transistor may be required to have different properties.

Figure 10:
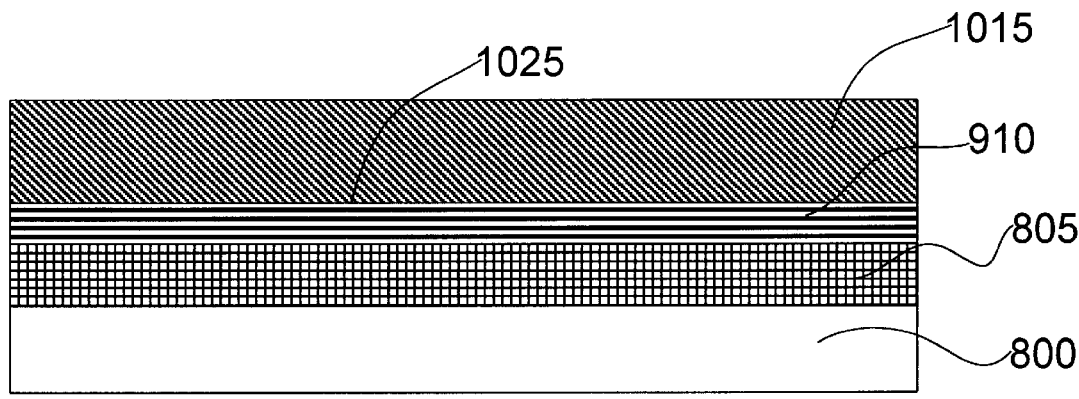
Figure 11:
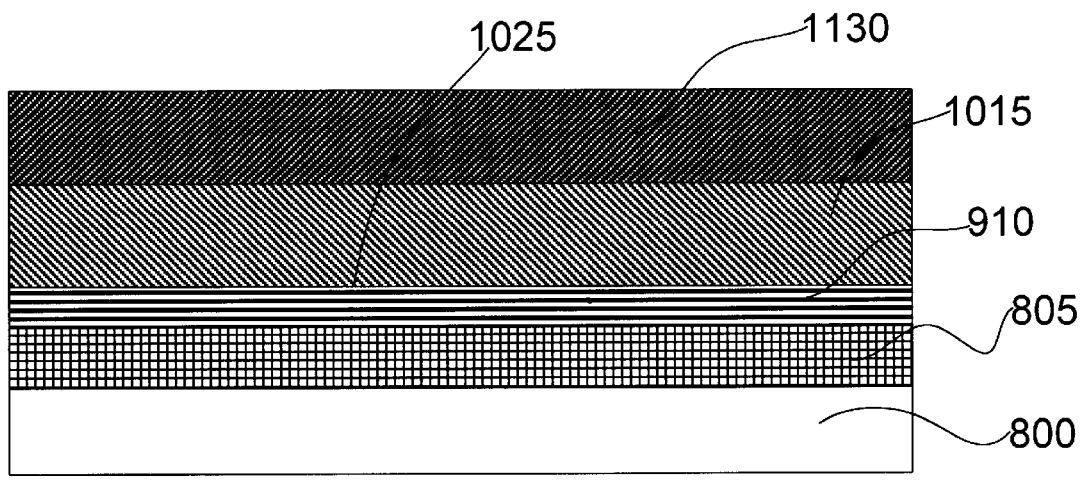

As described above, actions illustrative of embodiments of a method for transistor fabrication according to the present invention as shown in FIGS. 8–10 are substantially similar to those actions illustrated in FIGS. 1–3. As shown in FIG. 11, a second conductive layer 1130 may be formed above the first conductive layer 1015. The second conductive layer 1130, like the first conductive layer 1015, may be formed by a variety of known techniques for forming such layers, including, but not limited to, thermal growing, CVD, PVD, LPCVD, PECVD, and the like, and may have a thickness ranging from approximately 1000–2000 Å, for example. In one illustrative embodiment, the second conductive layer 1130 is comprised of cobalt (Co), having a thickness of approximately 1000 Å.

The second conductive layer 1130 may be formed of aluminum (Al), tungsten (W), tantalum (Ta), titanium (Ti), cobalt (Co), copper (Cu), titanium nitride ($Ti_xN_y$, eg, TiN) tantalum nitride ($Ta_xN_y$, e.g., TaN), tungsten nitride ($W_xN_y$, e.g., $WN_2$), and the like. Such a second conductive layer 1130 is illustrated in transistors 1985A and 1985B in FIG. 19, and in transistors 2085A and 2085B in FIG. 20, for example, as described more fully below. Alternatively, the second conductive layer 1130 may be formed of doped polysilicon that is then subjected to an anneal to render the doped polysilicon more conductive. Such a doped polysilicon second conductive layer 1130 may then be subjected to a self-aligned silicidation (salicidation) process to render the doped polysilicon even more conductive, as illustrated in transistors 2185A and 2185B in FIG. 21, for example, as described more fully below.

Figure 12:
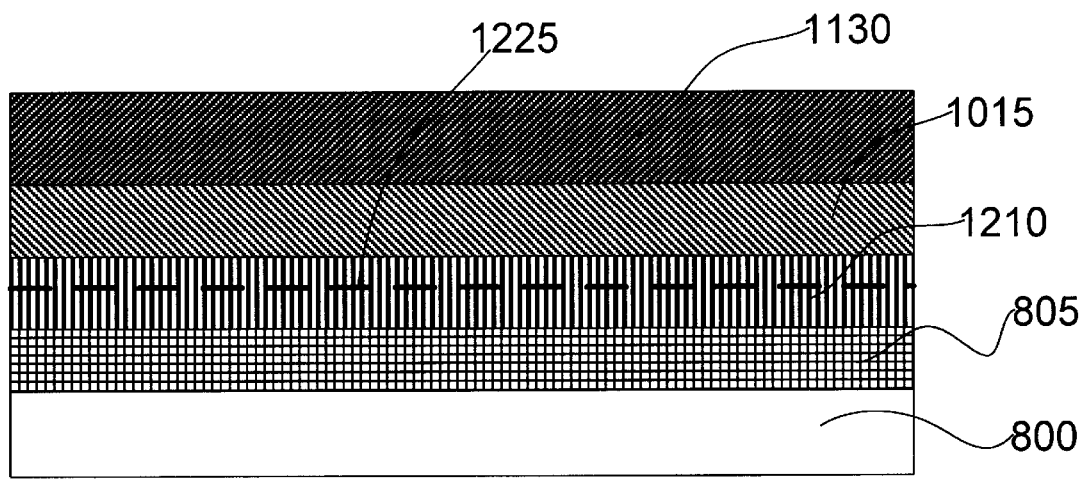

As described above, and as shown in FIG. 12, a silicided layer 1210 is formed by siliciding a portion the first conductive layer 1015 using at least a portion, and in certain cases all, of the silicidable layer 910 (see FIGS. 9–11). The dashed line 1225 illustrates where the top surface 1025 of the silicidable layer 910 (see FIGS. 9–11) was before the silicidation. As shown in FIGS. 11–12, the formation of the silicided layer 1210 may follow the formation of the second conductive layer 1130. Indeed, there may be embodiments in which the formation of the silicided layer 1210 (2215 in FIG. 22) is substantially the last action performed in the fabrication of an upper layer of transistors as illustrated in FIGS. 19–23.

Alternatively, as shown above in FIG. 4, the formation of the silicided layer 410 may precede the formation of a second conductive layer 1130. Indeed, there may be embodiments in which the silicided layer 410 (1210 in FIG. 23) is formed without having a second conductive layer 1130 formed at all, as illustrated in FIGS. 4–7 and FIG. 23, for example. In such embodiments, the gate conductor 745 (see FIG. 7) comprises only the first conductive layer 315 (2315 in FIG. 23) and the silicided layer 410 (1210 in FIG. 23).

Figure 13:
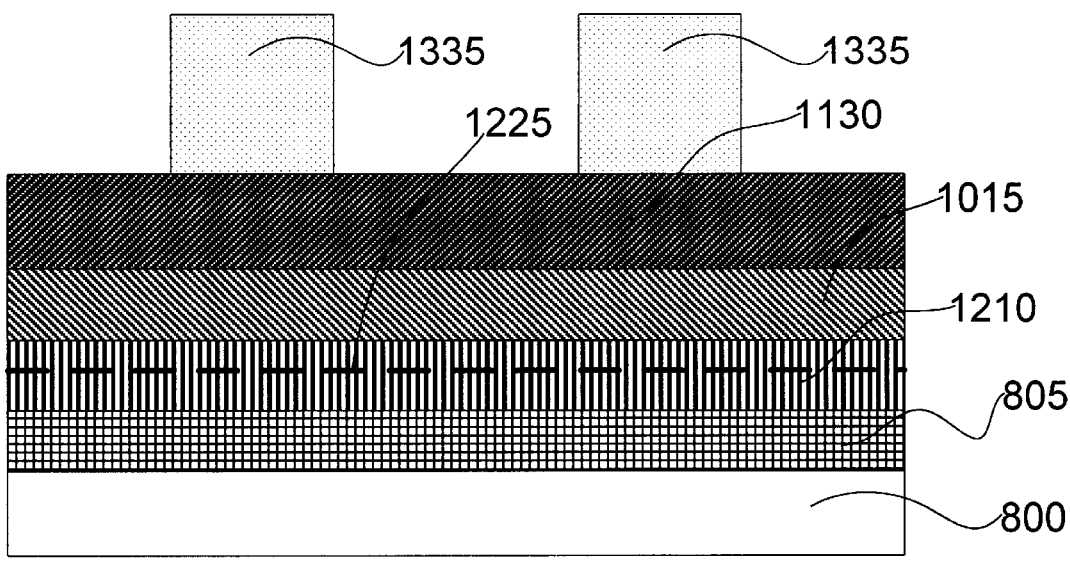
Figure 14:
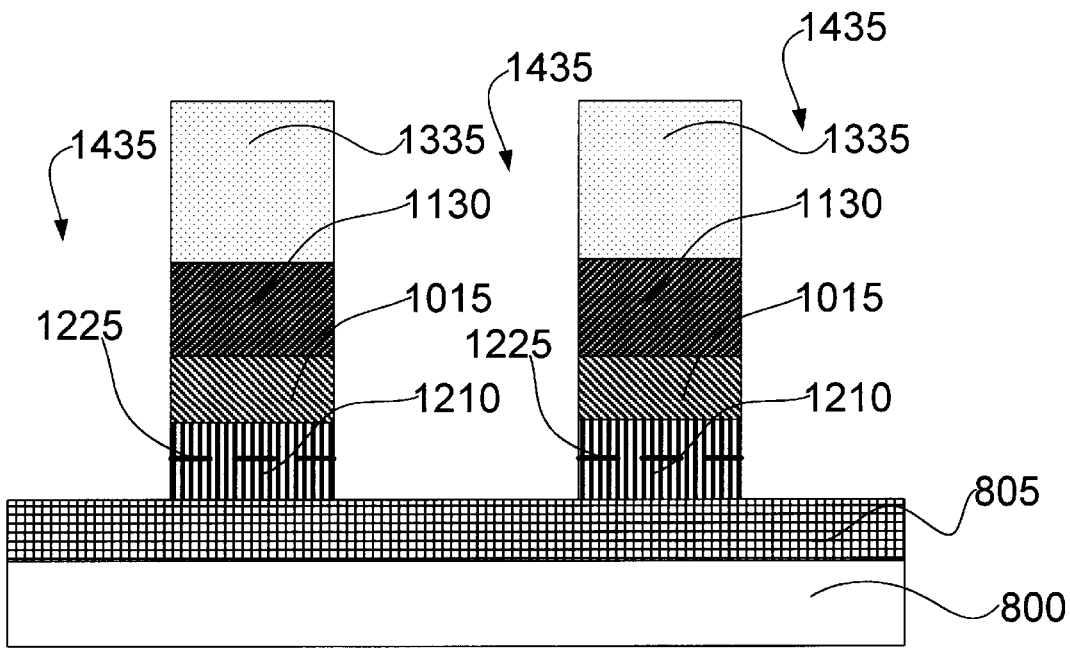

As shown in FIG. 13, a mask 1335 of photoresist, for example, may be formed above the second conductive layer 1130 and may then be patterned. The photoresist mask 1335 may have a thickness ranging from approximately 10000–15000 Å (10 kÅ–15 kÅ), for example. As shown in FIGS. 13–14, the first and second conductive layers 1015 and 1130, and the silicided layer 1210 may then be etched, using the patterned photoresist mask 1335, for example, forming the openings 1435. Alternatively, similar to the embodiments illustrated in FIGS. 5–6, the first and second conductive layers 1015 and 1130, the silicided layer 1210 and also the dielectric layer 805 may be etched, using the patterned photoresist mask 1335, for example.

Figure 15:
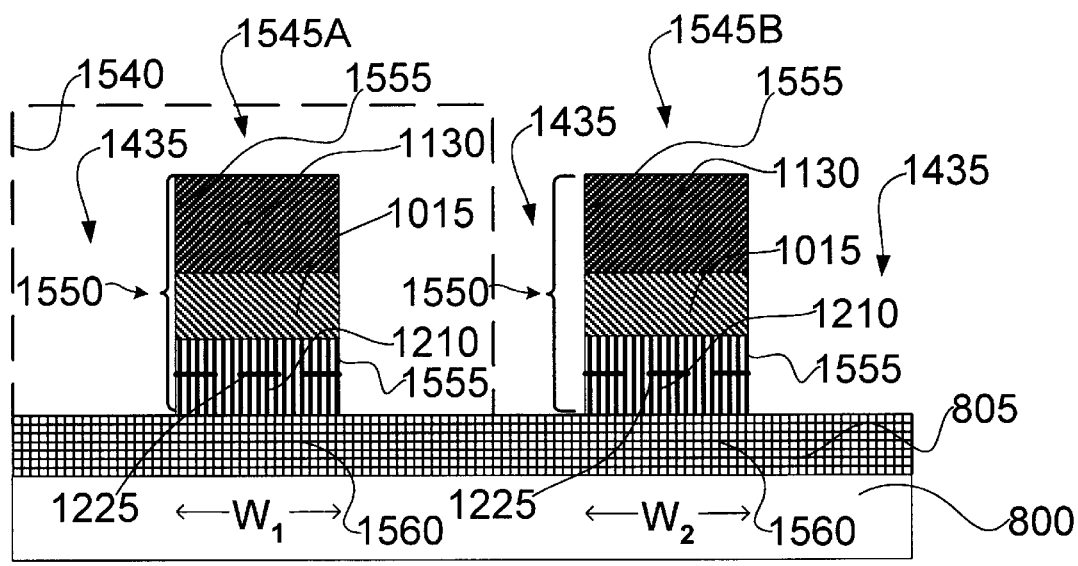

As shown in FIG. 15, the openings 1435 define gate structures 1545A and 1545B having gate conductors 1550, having sides 1555, and gate dielectrics 1560 comprising the portions of the gate dielectric layer 805 lying under the gate conductors 1550. The gate conductors 1550 include portions of the first and second conductive layers 1015 and 1130, and the silicided layer 1210. As shown in FIG. 15, the photoresist mask 1335 (see FIGS. 13–14), for example, may then be removed by being stripped off.

As shown in FIGS. 13–15, the openings 1435 and gate structures 1545A and 1545B may be formed using a variety of known photolithography and etching techniques, such as an anisotropic etching process using hydrogen bromide (HBr) and argon (Ar) as the etchant gases, for example. The gate structures 1545A and 1545B may have widths $W_1$ and $W_2$, respectively, that may be varied as a matter of design choice. For example, the widths $W_1$ and $W_2$ of the gate structures 1545A and 1545B may range from approximately 1000–2000 Å. The gate structures 1545A and 1545B may have substantially the same widths $W_1$ and $W_2$. Alternatively, the gate structures 1545A and 1545B may have substantially different widths $W_1$ and $W_2$, respectively, such as in a CMOS structure, for example, where the NMOS transistor and the PMOS transistor may be required to have different properties.

As shown in FIG. 15, the gate structure 1545A may have a masking structure 1540 (shown in phantom) formed around it so that the gate structure 1545B may be processed differently. Several masking structures, similar to the masking structure 1540 (shown in phantom), may be successively and/or alternately used around the gate structures 1545A and 1545B to accomplish multiple differential processing actions, for example.

In the formation of a CMOS structure, for example, the doping of the NMOS transistor may be different than the doping of the PMOS transistor. The masking structure 1540 would then prevent the gate structure 1545A (and adjacent portions of the dielectric layer 805 and the substrate 800) from being doped by the dopant implantation(s) of the gate structure 1545B (and adjacent portions of the dielectric layer 805 and the substrate 800). A masking structure similar to the masking structure 1540 (shown in phantom) may then be formed around the gate structure 1545B. Such a masking structure would then prevent the gate structure 1545B (and adjacent portions of the dielectric layer 805 and the substrate 800) from being doped by the different dopant implantation(s) of the gate structure 1545A (and adjacent portions of the dielectric layer 805 and the substrate 800).

Similarly, in the formation of a CMOS structure, the work functions of the gate conductors 1550 for the NMOS and PMOS transistors may be tuned by masking the Co gate conductor of the NMOS transistor, for example. The Co gate conductor of the PMOS transistor may then be etched away without affecting the masked Co gate conductor of the NMOS transistor. The Co gate conductor of the PMOS transistor may then be replaced with a different material, such as Cu, for example. The replacement Cu gate conductor of the PMOS transistor may then be polished, for example, without affecting the masked Co gate conductor of the NMOS transistor.

Figure 16:
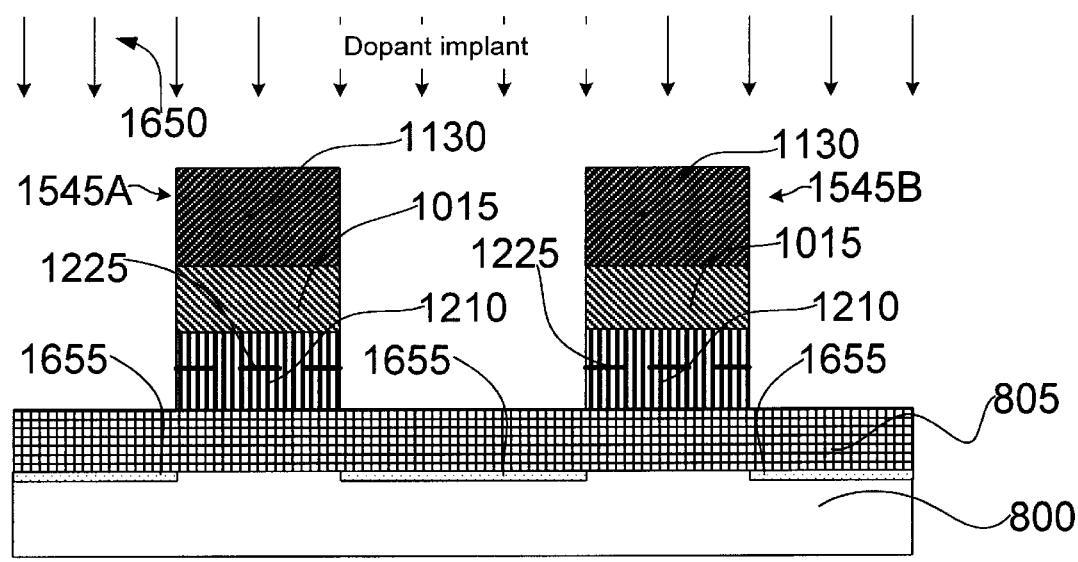

As shown in FIG. 16, a first dopant 1650 (indicated by arrows) may be implanted to introduce dopant atoms and/or molecules to form lightly doped drain (LDD) regions 1655. In particular, the first dopant 1650 may be implanted into the structure 800 through the dielectric layer 805 on either side of the gate structures 1545A and 1545B. During this implantation process, the gate structures 1545A and 1545B act as barriers to prevent the first dopant 1650 atoms and/or molecules from penetrating through the gate structures 1545A and 1545B into portions of the structure 800 lying beneath the gate structures 1545A and 1545B.

In one illustrative embodiment, the dose of the first dopant 1650 atoms and/or molecules may range from approximately $4.0 \times 10^{14} - 1.0 \times 10^{15}$ ions/cm$^2$ of the appropriate first dopant 1650 atoms and/or molecules, e.g., arsenic (As) for an illustrative N-channel MOSFET (NMOS transistor or NMOS) or boron (B) for an illustrative P-channel MOSFET (PMOS transistor or PMOS). The implant energy of the first dopant 1650 atoms may range from approximately 600 eV to 1 keV, and may lead to a relatively shallow implant. In another illustrative embodiment, the dose of first dopant 1650 atoms is approximately $4.0 \times 10^{14}$ ions/cm$^2$ of arsenic (As) for an N-channel MOSFET (NMOS transistor or NMOS) or boron (B) for a P-channel MOSFET (PMOS transistor or PMOS) at an implant energy of approximately 600 eV.

The first dopant 1650 may be an N$^-$ implant, for example, such as phosphorus (P), arsenic (As), nitrogen (N), antimony (Sb), or bismuth (Bi) and the like, and may form lightly doped N$^-$ LDD regions 1655. An N$^-$ implant would be appropriate for the fabrication of an NMOS, for example. Alternatively, first dopant 1650 may be a P$^-$ implant, for example, such as boron (B), boron fluoride (BF, BF$_2$), aluminum (Al), gallium (Ga), Indium (In) or Thallium (Tl) and the like, and may form lightly doped P$^-$ LDD 1655. A P$^-$ implant would be appropriate for the fabrication of a PMOS, for example. In one illustrative embodiment, the use of a nitride, a nitrogen-bearing oxide, a nitrogen-doped and/or an N$_2$-implanted oxide for the dielectric layer 805 may keep the relatively lightweight and mobile boron (B) atoms of a P$^-$ implant from migrating upwards.

The semiconductor device may next be subjected to a heat-treating process to drive the first dopant 1650 atoms and/or molecules under the gate structures 1545A and 1545B, as illustrated by the LDD implant regions 1655 shown in FIGS. 19–23, for example. Alternatively, the heat-treating process may be performed after the introduction of second dopant 1850 atoms and/or molecules (see FIG. 18). The heat-treating process may be performed by a variety of known techniques. For example, the heat-treating process may be a rapid thermal anneal (RTA) process performed at a temperature ranging from approximately 1050–1200° C. for a time ranging from approximately 60 seconds to approximately 2 minutes. Alternatively, the heat-treating process may be performed in a traditional tube furnace at a temperature ranging from approximately 1000–1150° C. for a time period ranging from approximately 30–90 minutes.

Figure 17:
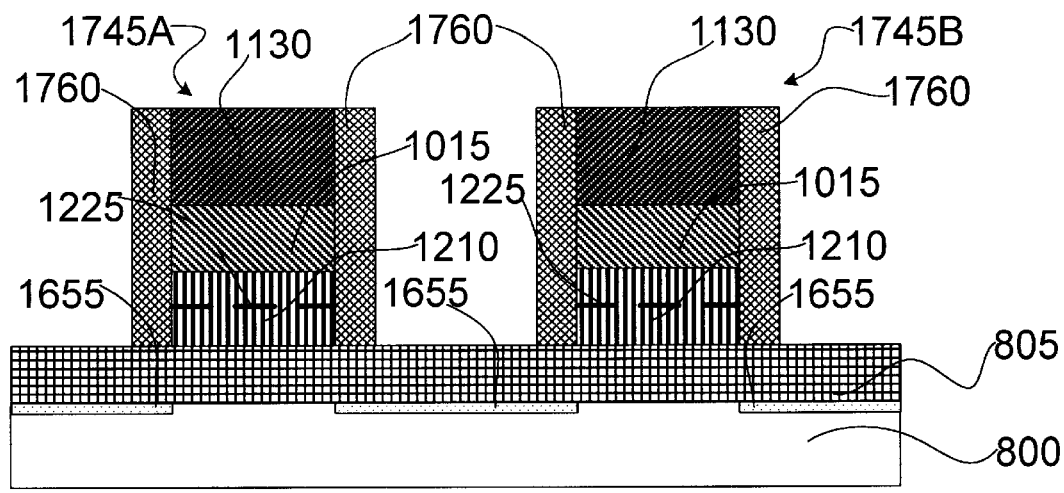

As shown in FIG. 17, insulated gate structures 1745A and 1745B may be formed by forming dielectric spacers 1760 on the sides 1555 (see FIG. 15) of the gate structures 1545A and 1545B by a variety of techniques. For example, the dielectric spacers 1760 may be formed by depositing a conformal layer of the appropriate material above and adjacent the gate structures 1545A and 1545B (see FIG. 15) and then performing an anisotropic reactive ion etching (RIE) process on the conformally blanket-deposited layer. The dielectric spacers 1760 may each have a base thickness ranging from approximately 150–600 Å, for example, as measured horizontally from the sides 1555 (see FIG. 15) of the gate structures 1545A and 1545B. The dielectric spacers 1760, like the dielectric layer 805, may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), nitrogen-bearing $SiO_2$, silicon nitride ($Si_3N_4$), silicon oxynitride ($Si_xO_yN_z$), and the like. The dielectric spacers 1760 may also be formed of any suitable "low dielectric constant" or "low K" material, where K is less than or equal to about 4. Additionally, the dielectric spacers 1760 may be comprised of a fluorine-doped oxide, a fluorine-doped nitride, a fluorine-doped oxynitride, a fluorine-doped low K material, and the like. In one illustrative embodiment, the dielectric spacers 1760 are comprised of $SiO_2$, having a base thickness of approximately 150 Å.

Figure 18:
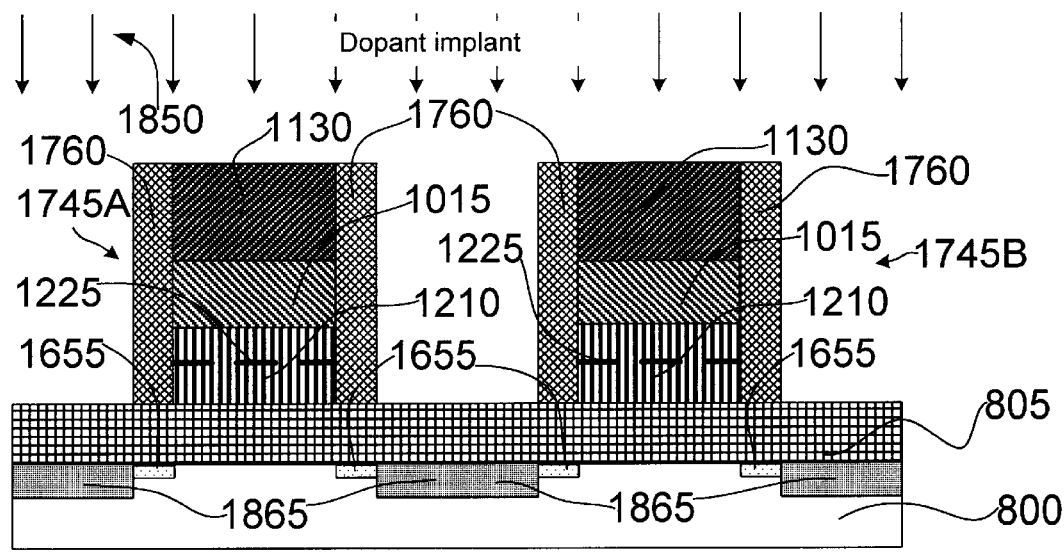

As shown in FIG. 18, a second dopant 1850 (indicated by arrows) may be implanted to introduce dopant atoms and/or molecules to form heavily doped source/drain regions 1865. In particular, the second dopant 1850 may be implanted into the structure 800 through the dielectric layer 805 on either side of the insulated gate structures 1745A and 1745B. During this implantation process, the insulated gate structures 1745A and 1745B act as barriers to prevent the second dopant 1850 atoms and/or molecules from penetrating through the insulated gate structures 1745A and 1745B into portions of the structure 800 lying beneath the insulated gate structures 1745A and 1745B.

In one illustrative embodiment, the dose of the second dopant 1850 atoms and/or molecules may range from approximately $2.0 \times 10^{15}$–$9.0 \times 10^{15}$ ions/cm$^2$ of the appropriate second dopant 1850 atoms and/or molecules, e.g., arsenic (As) for an illustrative N-channel MOSFET (NMOS transistor or NMOS) or boron (B) for an illustrative P-channel MOSFET (PMOS transistor or PMOS). The implant energy of the second dopant 1850 atoms and/or molecules may range from approximately 2–10 keV. In another illustrative embodiment, the dose of the second dopant 1850 atoms is approximately $2.0 \times 10^{15}$ ions/cm$^2$ of arsenic (As) for an N-channel MOSFET (NMOS transistor or NMOS) or boron (B) for a P-channel MOSFET (PMOS transistor or PMOS) at an implant energy of approximately 2 keV.

The second dopant 1850 may be an $N^+$ implant, for example, such as phosphorus (P), arsenic (As), nitrogen (N), antimony (Sb), or bismuth (Bi) and the like, and may form heavily doped $N^+$ source/drain regions 1865. An $N^+$ implant would be appropriate for the fabrication of an NMOS, for example. Alternatively, the second dopant 1850 may be a $P^+$ implant, for example, such as boron (B), boron fluoride (BF, $BF_2$), aluminum (Al), gallium (Ga), Indium (In) or Thallium (Tl) and the like, and may form heavily doped $P^+$ source/drain regions 1865. A $P^+$ implant would be appropriate for the fabrication of a PMOS, for example. In one illustrative embodiment, the use of a nitride, a nitrogen-bearing oxide, a nitrogen-doped and/or an $N_2$-implanted oxide for the dielectric layer 805 may keep the relatively lightweight and mobile boron (B) atoms of a $P^+$ implant from migrating upwards.

The semiconductor device may next be subjected to a heat-treating process to drive the second dopant 1850 atoms and/or molecules throughout the source/drain regions 1865, as illustrated in FIGS. 19–23, for example. As described above, the heat-treating process to drive the first dopant 1650 atoms and/or molecules under the gate structures 1545A and 1545B, as illustrated by the LDD implant regions 1655 shown in FIGS. 19–23, for example, may be a separate heat-treating process performed before the heat-treating process that is performed to drive the second dopant 1850 atoms and/or molecules throughout the source/drain regions 1865. Alternatively, only one heat-treating process may be performed after the introduction of the second dopant 1850 atoms and/or molecules. The heat-treating process may be performed by a variety of known techniques. For example, the heat-treating process may be a rapid thermal anneal (RTA) process performed at a temperature ranging from approximately 1050–1200° C. for a time ranging from approximately 60 seconds to 2 minutes. Alternatively, the heat-treating process may be performed in a traditional tube furnace at a temperature ranging from approximately 1000–1150° C. for a time period ranging from approximately 30–90 minutes.

As will be recognized by one skilled in the art, the doping of the source/drain regions 1865 may be accomplished by a variety of different techniques. For example, if desired, the appropriate second dopant 1850 atoms may be added during the formation of the substrate 800, i.e., dopant atoms, such as arsenic, may be added during the deposition process used to form the substrate 800. Alternatively, an undoped the substrate 800 may be formed and thereafter subjected to an ion implantation process and heat-treating process before other overlying layers are formed. As will be known to those skilled in the art, there are a variety of other techniques and methods for introducing dopant atoms into the portion of the substrate 800 that will ultimately become the source/drain regions 1865. Thus, the particular technique used to accomplish this objective should not be considered a limitation of the present invention.

As stated previously, the present invention may be used to form a plurality of transistors above other previously formed transistors, i.e., the present invention may be used to form multiple layers of transistors. For example, as shown in FIGS. 19–23, semiconductor devices, such as MOS structures 1900B, 2000B, 2100B, 2200B and 2300B similar to the MOS structure as shown in FIG. 18, are formed above other semiconductor devices, such as CMOS structures 1900A, 2000A, 2100A, 2200A and 2300A. As shown in FIGS. 19–23, the CMOS structures 1900A, 2000A, 2100A, 2200A and 2300A are examples of structures 100 and 800 as shown in FIGS. 1–18.

The transistors 1985A, 1985B, 2085A, 2085B, 2185A, 2185B, 2285A, 2285B, 2385A and 2385B in the respective MOS structures 1900B, 2000B, 2100B, 2200B and 2300B may be NMOS or PMOS. The transistors 1985C, 2085C, 2185C, 2285C and 2385C in the respective CMOS structures 1900A, 2000A, 2100A, 2200A and 2300A may be NMOS or PMOS, while the transistors 1985D, 2085D, 2185D, 2285D and 2385D in the respective CMOS structures 1900A, 2000A, 2100A, 2200A and 2300A may be, complementarily, PMOS or NMOS. The transistors 1985C, 2085C, 2185C, 2285C and 2385C may be separated, by respective trench isolation dielectric structures 1990, 2090, 2190, 2290 and 2390, from the transistors 1985D, 2085D, 2185D, 2285D and 2385D in the respective CMOS structures 1900A, 2000A, 2100A, 2200A and 2300A. The respective dielectric layers 1995, 2095, 2195, 2295 and 2395 separate and isolate the transistors 1985A, 1985B, 2085A, 2085B, 2185A, 2185B, 2285A, 2285B, 2385A and 2385B in the respective MOS structures 1900B, 2000B, 2100B, 2200B and 2300B from the transistors 1985C, 1985D, 2085C, 2085D, 2185C, 2185D, 2285C, 2285D, 2385C and 2385D in the respective CMOS structures 1900A, 2000A, 2100A, 2200A and 2300A.

Figure 19:
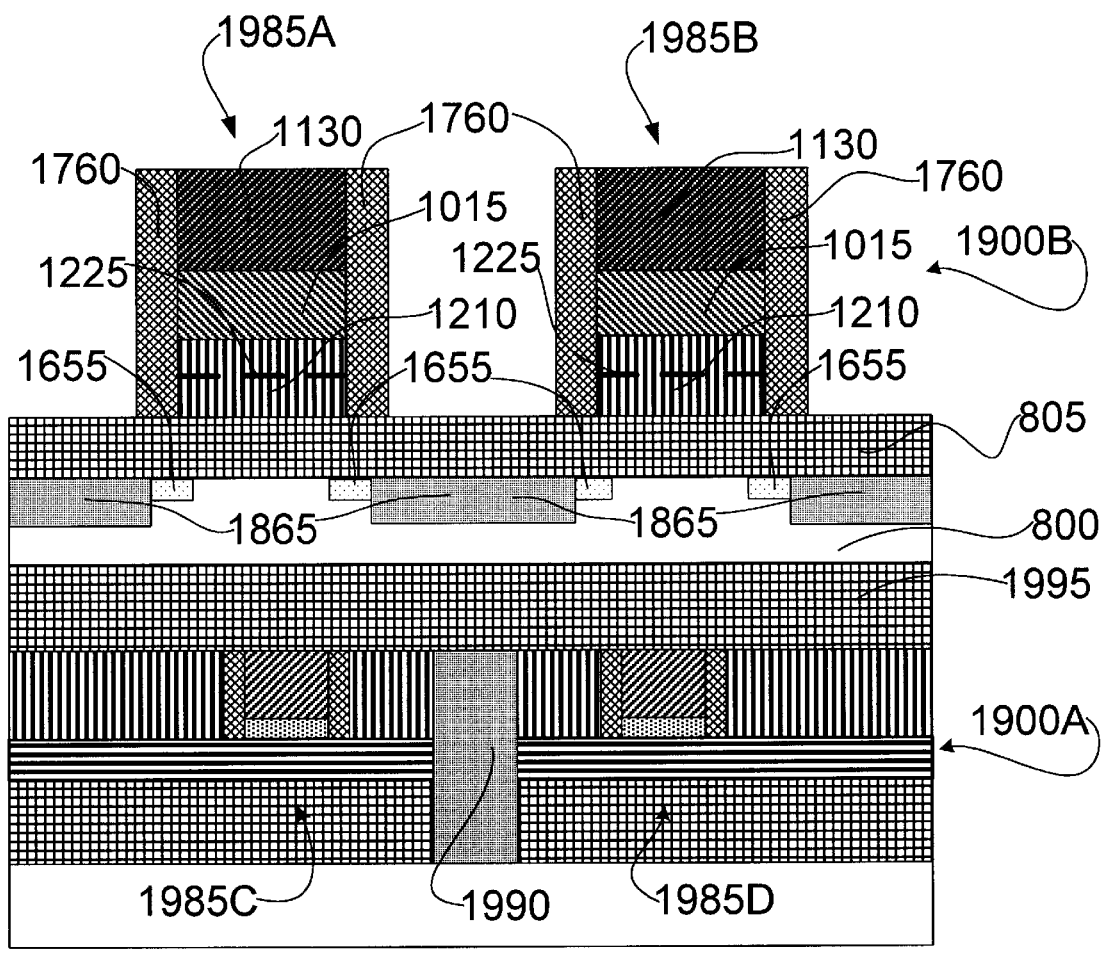
FIGS. 19–23 illustrate schematically in cross-section other embodiments of a method for transistor fabrication according to the present invention.
Figure 20:
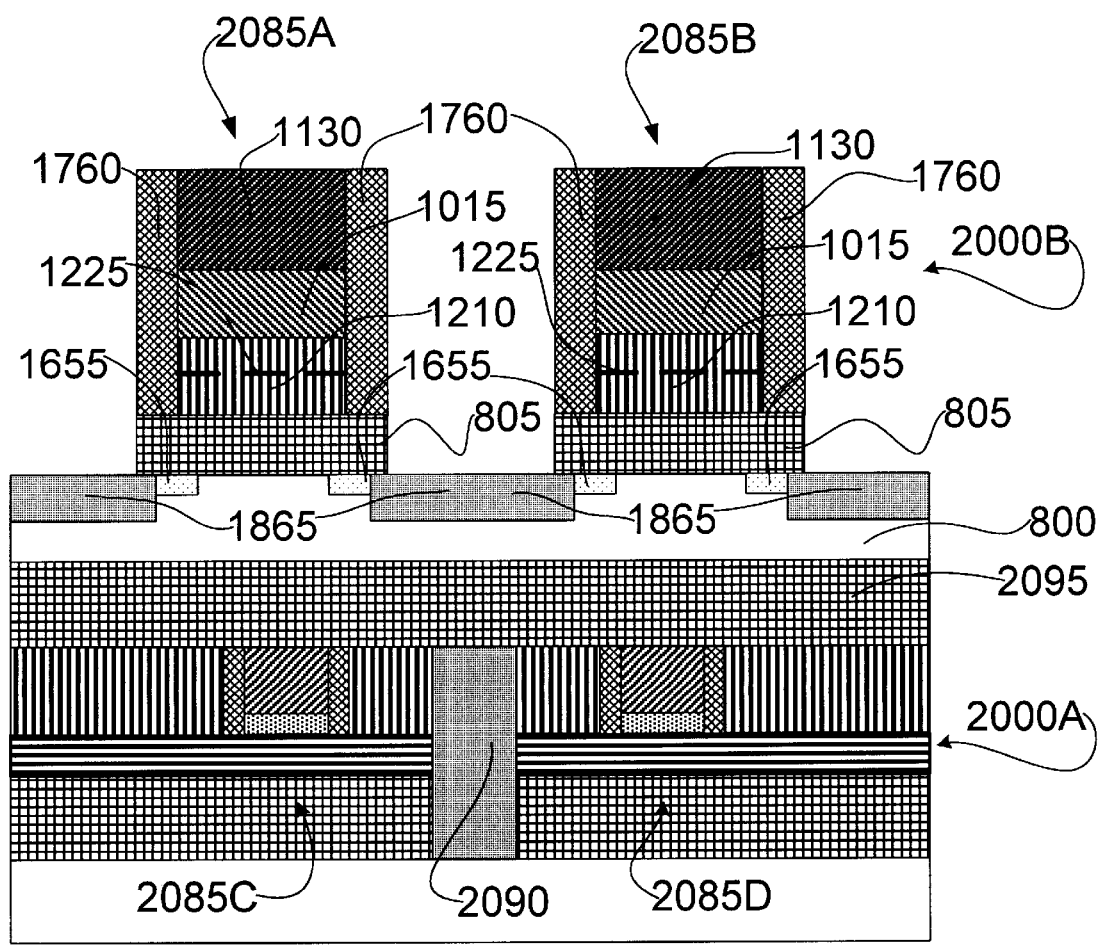
Figure 21:
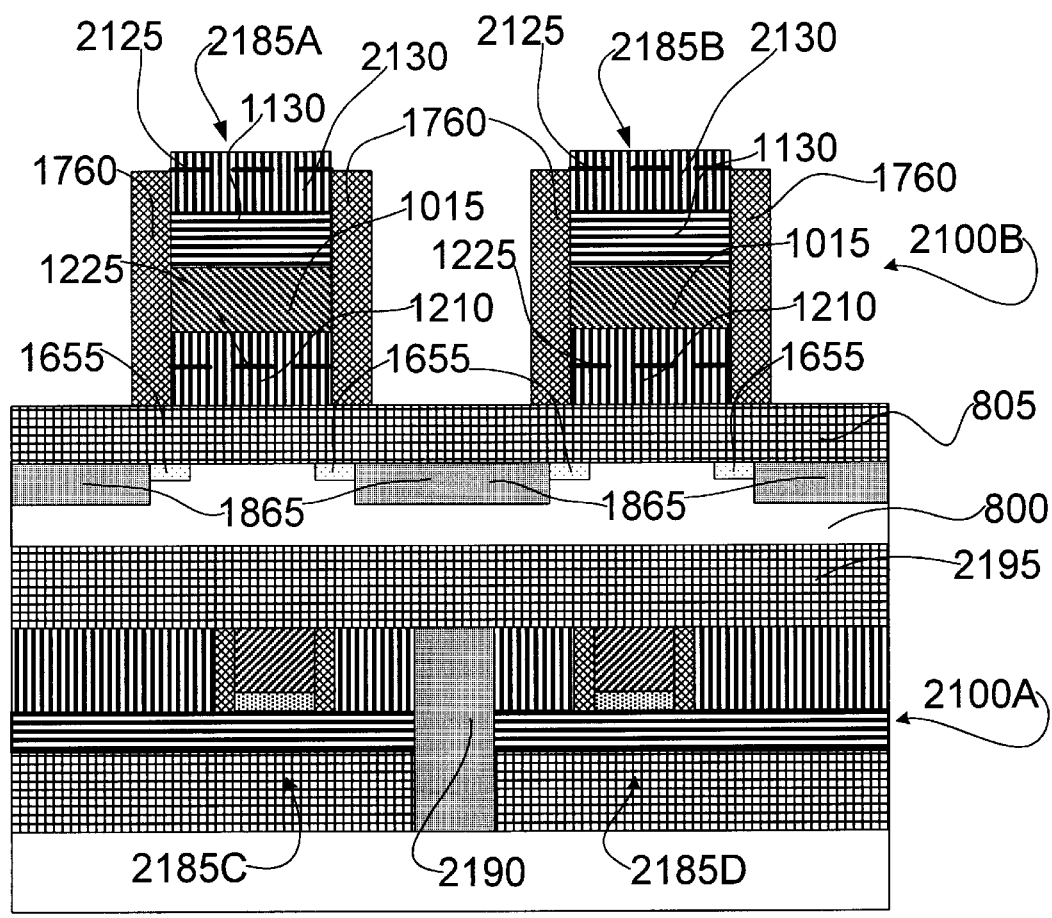
Figure 22:
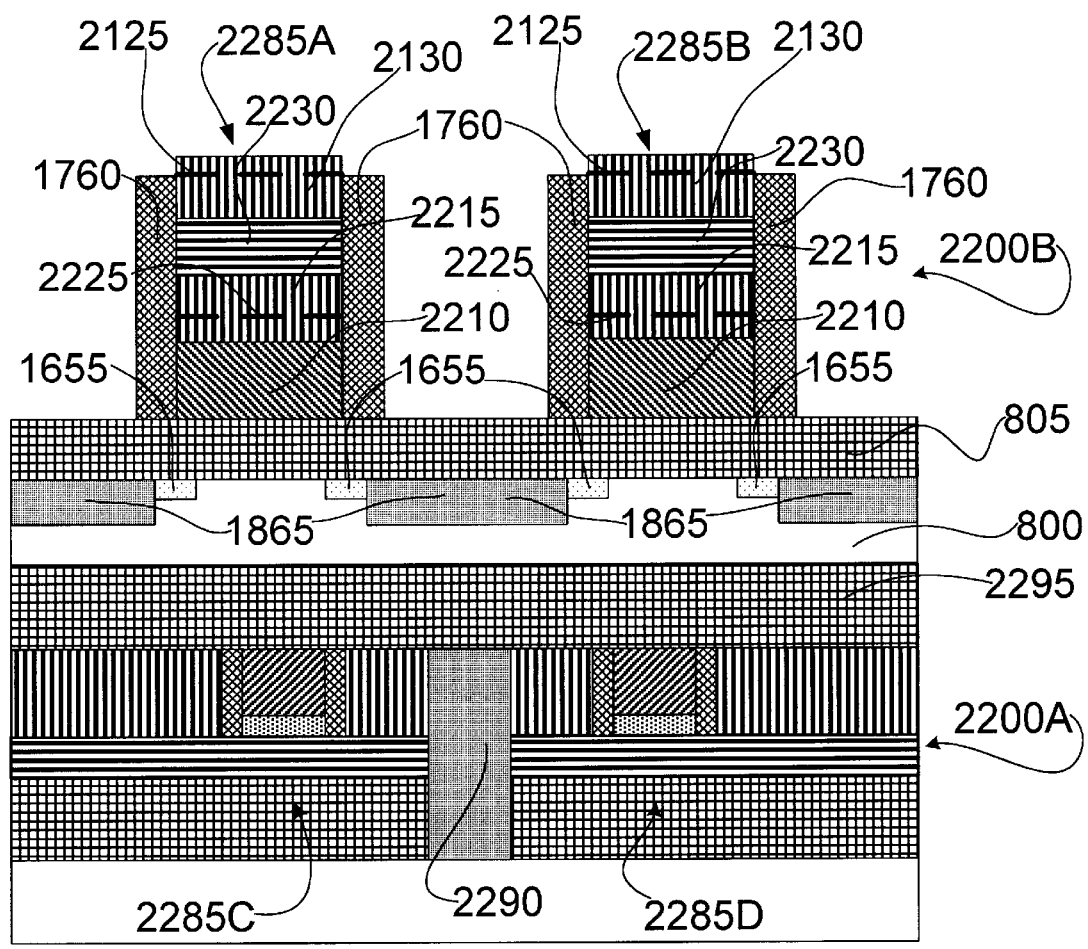
Figure 23:
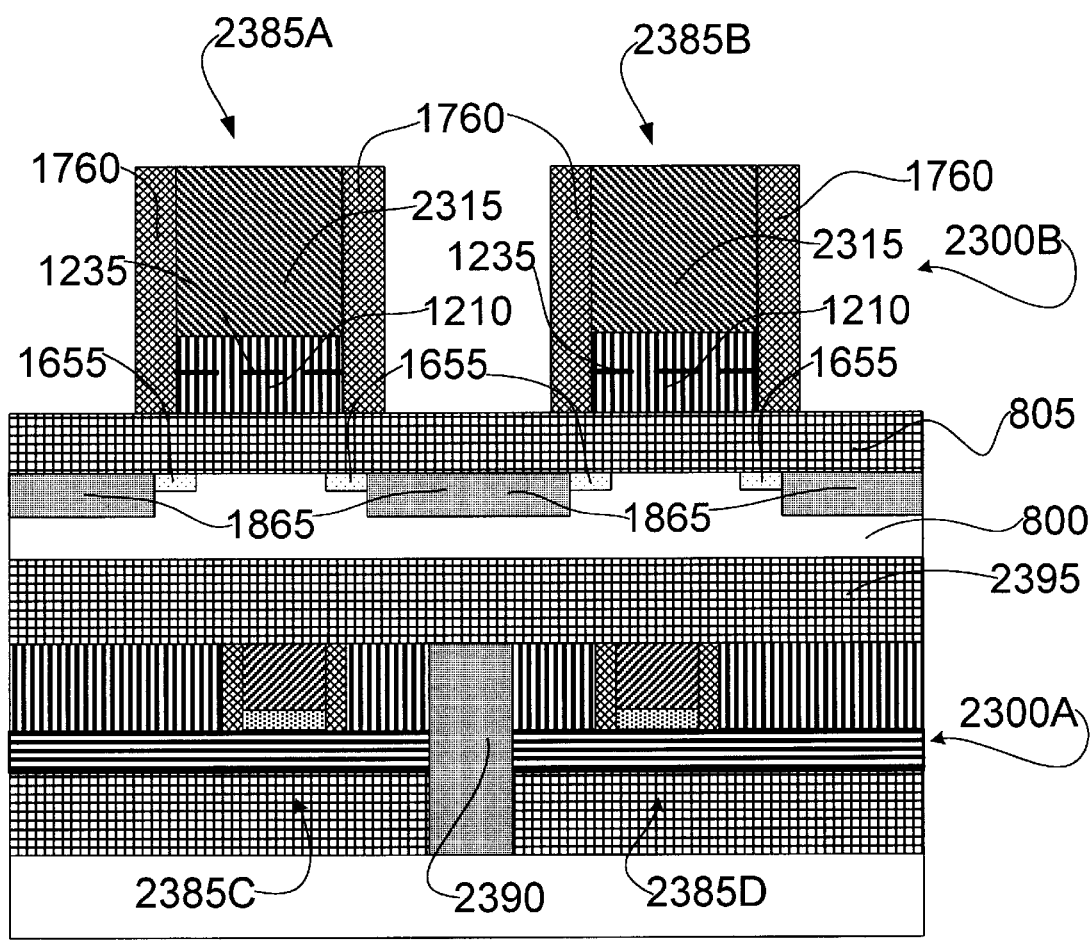

FIG. 19 illustrates the structures shown in FIG. 18 following the heat-treating process to drive the second dopant 1850 atoms and/or molecules throughout the source/drain regions 1865, for example. FIG. 20 illustrates an alternative embodiment, similar to the embodiments as shown in FIGS. 5–7 (illustrating the formation of the gate dielectrics 705), in which the dielectric layer 805 (105 in FIGS. 1–6) has been etched away to expose the substrate 800(100 in FIGS. 1–7).

As described above, FIG. 21 illustrates another alternative embodiment in which the second conductive layer 1130 is formed of doped polysilicon that is then subjected to a self-aligned silicidation (salicidation) process to render the doped polysilicon more conductive, as illustrated in transistors 2185A and 2185B in FIG. 21, for example. In particular, a self-aligned silicided (salicided) gate layer 2130 is formed only above the doped polysilicon second conductive layer 1130.

The salicided gate layer 2130 may be formed, for example, by first blanket-depositing a saliciding layer (not shown) comprised of tungsten (W), tantalum (Ta), titanium (Ti), cobalt (Co), copper (Cu), and the like, above the dielectric layer 805, adjacent the dielectric spacers 1760 and above the doped polysilicon second conductive layer 1130. Thereafter, the transistors are subjected to a heat-treating process to convert the saliciding layer (not shown) into a metal silicide. The dashed line 2125 illustrates where the interface between the blanket-deposited saliciding layer (not shown) and the doped polysilicon second conductive layer 1130 was before the silicidation.

It is believed that only upper portions of the doped polysilicon second conductive layer 1130 would be consumed to form the metal silicide of the salicided gate layer 2130. It is further believed that the dielectric layer 805 and the dielectric spacers 1760 would prevent silicide formation on the dielectric layer 805 and the dielectric spacers 1760, facilitating the self-alignment of the salicidization process. The salicidization process renders the doped polysilicon second conductive layer 1130 more conductive by providing the salicided gate layer 2130, lowering the overall resistivity of the gates of the transistors 2185A and 2185B.

In one illustrative embodiment, lower portions of the first conductive layer 1015 are first subjected to a silicidation process to form the silicided layer 1210, as described above, and as shown in FIG. 12, for example. Subsequently, upper portions of a doped polysilicon second conductive layer 1130 are later subjected to a salicidation process with a blanket-deposited saliciding layer (not shown) to form the salicided gate layer 2130, as described above, and as shown in FIG. 21, for example. In another illustrative embodiment, lower portions of the first conductive layer 1015 are subjected to a silicidation process to form the silicided layer 1210 at substantially the same time that upper portions of the doped polysilicon second conductive layer 1130 are subjected to the salicidation process to form the salicided gate layer 2130.

Similarly, as described above, FIG. 22 illustrates yet another alternative embodiment in which there is no second conductive layer 1130 and the first conductive layer 2230 is formed of doped polysilicon that is then subjected to a self-aligned silicidation (salicidation) process to render the doped polysilicon more conductive, as illustrated in transistors 2285A and 2285B in FIG. 22, for example. In particular, a self-aligned silicided (salicided) gate layer 2130 is formed only above the doped polysilicon first conductive layer 2230.

In such an embodiment, lower portions of the doped polysilicon first conductive layer 2230, along with at least portions of the silicidable layer 2210, will be used to form the silicided layer 2215. The dashed line 2125 illustrates where the interface between the blanket-deposited saliciding layer (not shown) and the doped polysilicon first conductive layer 2230 was before the silicidation. Similarly, the dashed line 2225 illustrates where the interface between the silicidable layer 2210 and the doped polysilicon first conductive layer 2230 was before the silicidation. In this case, the silicidable layer 2210 may be titanium (Ti), cobalt (Co), tantalum (Ta), tungsten (W), and the like. In other such embodiments, the first conductive layer 2230 may be undoped silicon (Si), undoped polysilicon, amorphous silicon (α-Si), and the like.

In one illustrative embodiment, lower portions of a doped polysilicon first conductive layer 2230 are first subjected to a silicidation process with a silicidable layer 2210 to form the silicided layer 2215, as described above, similar to the embodiments shown in FIGS. 4 and 12, for example. Subsequently, upper portions of the doped polysilicon first conductive layer 2230 are later subjected to a salicidation process with a blanket-deposited saliciding layer (not shown) to form the salicided gate layer 2130, as described above, and as shown in FIG. 22, for example. In another illustrative embodiment, lower portions of the doped polysilicon first conductive layer 2230 are subjected to a silicidation process with the silicidable layer 2210 to form the silicided layer 2215 at substantially the same time that upper portions of the doped polysilicon first conductive layer 2230 are subjected to the salicidation process to form the salicided gate layer 2130.

As described above, FIG. 23 illustrates still another alternative embodiment in which there is no second conductive layer 1130 and in which the silicided layer 1210 is formed using only a first conductive layer 2315, as illustrated in FIGS. 4–7, for example. In such embodiments, the gate conductors of the transistors 2385A and 2385B comprise only portions of the first conductive layer 2315 and the silicided layer 1210.

Any of the above-disclosed embodiments of a method for fabricating a transistor according to the present invention provides for increased operating speed and performance of the transistor. Additionally, the present invention allows formation of gate conductors with decreased resistivity and increased conductivity. Moreover, the present invention reduces and/or substantially eliminates any "poly depletion effects," and allows more drive current. Furthermore, the above-disclosed embodiments of methods for transistor fabrication according to the present invention enable transistor fabrication with increased device density and precision and enable a streamlined and simplified process flow, thereby decreasing the complexity and lowering the costs of the manufacturing process and increasing reliability and throughput.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for fabricating a semiconductor device, the method comprising:

forming a dielectric layer above a structure;

forming a silicidable layer above the dielectric layer;

forming a first conductive layer above the silicidable layer;

forming a silicided layer by siliciding a portion of the first conductive layer using at least a portion of the silicidable layer; and forming a gate conductor having sides by patterning the silicided layer and the first conductive layer.

2. The method of claim 1, wherein forming the gate conductor further comprises:

forming a second conductive layer above the first conductive layer; and forming the gate conductor having sides by patterning the second conductive layer along with the silicided layer and the first conductive layer, the method further comprising:

implanting a first dopant dose through the dielectric layer into the structure to form lightly doped source/drain regions;

forming dielectric spacers on the sides of the gate conductor; and implanting a second dopant dose through the dielectric layer into the structure to form heavily doped source/drain regions.

3. The method of claim 1, wherein forming the silicidable layer comprises forming the silicidable layer from one of polysilicon, amorphous silicon, titanium, cobalt, tantalum, and tungsten.

4. The method of claim 1, wherein forming the first conductive layer comprises forming the first conductive layer from one of polysilicon, amorphous silicon, titanium, cobalt, tantalum, and tungsten.

5. The method of claim 1, wherein forming the dielectric layer comprises forming the dielectric layer from one of a nitride, a nitrogen-implanted oxide, a nitrogen-bearing oxide and a high K material with K at least about 8.

6. The method of claim 2, wherein forming the second conductive layer comprises forming the second conductive layer from one of titanium, cobalt, tantalum, tungsten, polysilicon, copper, aluminum, titanium nitride, tantalum nitride, and tungsten nitride.

7. The method of claim 2, wherein forming the second conductive layer includes forming the second conductive layer after forming the silicided layer.

8. The method of claim 2, wherein forming the silicided layer includes forming the silicided layer after forming the second conductive layer.

9. The method of claim 2, wherein forming the dielectric spacers comprises forming the dielectric spacers from one of an oxide, a nitride, an oxynitride, a low K material with K at most about 4, a fluorine-doped oxide, a fluorine-doped nitride, a fluorine-doped oxynitride, and a fluorine-doped low K material with K at most about 4.

10. The method of claim 6, wherein forming the second conductive layer comprises forming the second conductive layer from polysilicon and subjecting the second conductive layer to one of silicidation and salicidation.

11. A method for fabricating a transistor, the method comprising:

forming a dielectric layer above a substrate layer;

forming a silicidable layer above the dielectric layer;

forming a first conductive layer above the silicidable layer;

forming a second conductive layer above the first conductive layer;

forming a silicided layer by siliciding a portion of the first conductive layer using the silicidable layer;

forming a gate conductor having sides by patterning the first and second conductive layers and the silicided layer;

implanting a first dopant dose through the dielectric layer into the substrate layer to form lightly doped drain regions;

forming dielectric spacers on the sides of the gate conductor; and implanting a second dopant dose through the dielectric layer into the substrate layer to form heavily doped source/drain regions.

12. The method of claim 11, wherein forming the silicidable layer comprises forming the silicidable layer from one of polysilicon and amorphous silicon, forming the first conductive layer comprises forming the first conductive layer from one of titanium, cobalt, tantalum, and tungsten, and forming the second conductive layer comprises forming the second conductive layer from one of titanium, cobalt, tantalum, tungsten, polysilicon, copper, aluminum, titanium nitride, tantalum nitride, and tungsten nitride.

13. The method of claim 11, wherein forming the dielectric layer comprises forming the dielectric layer from one of a nitride, a nitrogen-implanted oxide, a nitrogen-bearing oxide and a high K material with K at least about 8, and forming the dielectric spacers comprises forming the dielectric spacers from one of an oxide, a nitride, an oxynitride, a low K material with K at most about 4, a fluorine-doped oxide, a fluorine-doped nitride, a fluorine-doped oxynitride, and a fluorine-doped low K material with K at most about 4.

14. The method of claim 11, wherein forming the second conductive layer includes forming the second conductive layer after forming the silicided layer.

15. The method of claim 11, wherein forming the silicided layer includes forming the silicided layer after forming the second conductive layer.

16. A method for fabricating a MOSFET, the method comprising:

depositing a dielectric layer above a substrate layer, the dielectric layer having an equivalent oxide thickness in a range of about 10 Å–20 Å;

depositing a silicidable layer above the dielectric layer, the silicidable layer having a thickness in a range of about 50 Å–200 Å;

depositing a first conductive layer above the silicidable layer, the first conductive layer having a thickness in a range of about 25 Å–400 Å;

forming a second conductive layer above the first conductive layer, the second conductive layer having a thickness in a range of about 1000 Å–2000 Å;

forming a silicided layer by siliciding a portion of the first conductive layer using the silicidable layer;

forming a gate conductor having sides by patterning the first and second conductive layers and the silicided layer;

implanting a first dopant through the dielectric layer into the substrate layer to form lightly doped drain regions, a dose of the first dopant ranging from about $4.0 \times 10^{14}$–$1.0 \times 10^{15}$ ions/cm$^2$ at an implant energy ranging from about 0.6–1 keV;

forming dielectric spacers on the sides of the gate conductor, the dielectric spacers having a base thickness in a range of about 150 Å–600 Å; and implanting a second dopant through the dielectric layer into the substrate layer to form heavily doped source/drain regions, a dose of the second dopant ranging from about $2.0 \times 10^{15}$–$9.0 \times 10^{15}$ ions/cm$^2$ at an implant energy ranging from about 2–10 keV.

17. The method of claim 16, wherein forming the silicidable layer comprises forming the silicidable layer from one of polysilicon and amorphous silicon, forming the first conductive layer comprises forming the first conductive layer from one of titanium, cobalt, tantalum, and tungsten, and forming the second conductive layer comprises forming the second conductive layer from one of titanium, cobalt, tantalum, tungsten, polysilicon, copper, aluminum, titanium nitride, tantalum nitride, and tungsten nitride.

18. The method of claim 16, wherein forming the dielectric layer comprises forming the dielectric layer from one of a nitride, a nitrogen-implanted oxide, a nitrogen-bearing oxide and a high K material with K at least about 8, and forming the dielectric spacers comprises forming the dielectric spacers from one of an oxide, a nitride, an oxynitride, a low K material with K at most about 4, a fluorine-doped oxide, a fluorine-doped nitride, a fluorine-doped oxynitride, and a fluorine-doped low K material with K at most about 4.

19. The method of claim 16, wherein forming the second conductive layer includes forming the second conductive layer after forming the silicided layer.

20. The method of claim 16, wherein forming the silicided layer includes forming the silicided layer after forming the second conductive layer.

* * * * *